(12) United States Patent
Bae

(10) Patent No.: US 11,475,848 B2
(45) Date of Patent: Oct. 18, 2022

(54) DISPLAY APPARATUS AND METHOD OF COMPENSATING IMAGE OF DISPLAY PANEL USING THE SAME

(71) Applicant: Samsung Display Co., Ltd., Yongin-Si (KR)

(72) Inventor: Min-Seok Bae, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/223,282

(22) Filed: Apr. 6, 2021

(65) Prior Publication Data
US 2022/0059037 A1 Feb. 24, 2022

(30) Foreign Application Priority Data
Aug. 24, 2020 (KR) .................... 10-2020-0106426

(51) Int. Cl.
*G09G 3/3291* (2016.01)
*H01L 27/32* (2006.01)

(52) U.S. Cl.
CPC ....... *G09G 3/3291* (2013.01); *H01L 27/3234* (2013.01); *H01L 27/3262* (2013.01);
(Continued)

(58) Field of Classification Search
CPC ........... G09G 3/3291; G09G 2310/027; G09G 2300/0819; G09G 2300/0861; G09G 2310/0262; G09G 2320/0233; G09G 2320/0271; G09G 2320/029; G09G 2320/043; G09G 2330/026; G09G 2330/027; G09G 2360/145;
(Continued)

(56) References Cited

U.S. PATENT DOCUMENTS

| 2008/0042943 A1* | 2/2008 | Cok ..................... G09G 3/3225 345/77 |
| 2009/0135211 A1* | 5/2009 | Wang ..................... G09G 3/20 345/690 |

(Continued)

FOREIGN PATENT DOCUMENTS

KR 102027169 B1 10/2019

OTHER PUBLICATIONS

Extended European Search Report for Application No. 21190344.8-1210 dated Jan. 26, 2022.

*Primary Examiner* — Douglas M Wilson
(74) *Attorney, Agent, or Firm* — Cantor Colburn LLP

(57) ABSTRACT

A display apparatus includes a first compensator, a second compensator and a display panel including pixels. The first compensator generates a first compensation coefficient based on sensing data of a pixel of the pixels for a first grayscale value, generates a second compensation coefficient based on camera imaging data for a second grayscale value greater than the first grayscale value and compensates image data based on the first compensation coefficient and the second compensation coefficient. The second compensator compensates the image data by modeling sensing data of entire grayscale range based on sensing data of the pixel for a third grayscale value and a fourth grayscale value. The display panel displays an image based on the image data compensated by the first compensator and the second compensator.

20 Claims, 9 Drawing Sheets

(52) U.S. Cl.
CPC ...... *H01L 27/3265* (2013.01); *H01L 27/3276* (2013.01); *G09G 2300/0819* (2013.01); *G09G 2300/0861* (2013.01); *G09G 2310/027* (2013.01); *G09G 2310/0262* (2013.01); *G09G 2320/029* (2013.01); *G09G 2320/0233* (2013.01); *G09G 2320/0271* (2013.01); *G09G 2320/043* (2013.01); *G09G 2330/026* (2013.01); *G09G 2330/027* (2013.01); *G09G 2360/145* (2013.01); *G09G 2360/147* (2013.01)

(58) Field of Classification Search
CPC ............ G09G 2360/147; G09G 3/3233; H01L 27/3234; H01L 27/3262; H01L 27/3265; H01L 27/3276
See application file for complete search history.

(56) References Cited

U.S. PATENT DOCUMENTS

| | | | | |
|---|---|---|---|---|
| 2012/0206504 A1* | 8/2012 | Ha | ........................ | G09G 3/3208 345/690 |
| 2013/0120659 A1* | 5/2013 | Park | ........................ | G09G 5/02 348/E5.074 |
| 2014/0168451 A1* | 6/2014 | Lee | ........................ | G09G 3/20 348/189 |
| 2014/0253602 A1* | 9/2014 | Wu | ........................ | G09G 5/10 345/690 |
| 2015/0042688 A1* | 2/2015 | Kim | ........................ | G09G 3/3208 345/77 |
| 2015/0116387 A1* | 4/2015 | Jun | ........................ | G09G 3/20 345/694 |
| 2016/0086548 A1* | 3/2016 | Maeyama | ........................ | G09G 3/3233 345/82 |
| 2016/0125787 A1* | 5/2016 | Pyeon | ........................ | G09G 3/2022 345/691 |
| 2016/0171921 A1* | 6/2016 | Park | ........................ | G09G 3/2055 345/77 |
| 2016/0189612 A1* | 6/2016 | Lee | ........................ | G09G 3/2003 345/77 |
| 2017/0061865 A1* | 3/2017 | Park | ........................ | G09G 3/325 |
| 2017/0084227 A1* | 3/2017 | Bae | ........................ | G09G 3/3225 |
| 2017/0206825 A1* | 7/2017 | Cha | ........................ | G09G 3/3208 |
| 2018/0061913 A1* | 3/2018 | Kim | ........................ | G09G 3/3233 |
| 2018/0082627 A1* | 3/2018 | Deng | ........................ | G09G 3/2074 |
| 2018/0108288 A1* | 4/2018 | Kuang | ........................ | G09G 3/36 |
| 2018/0137819 A1 | 5/2018 | An et al. | | |
| 2018/0182278 A1 | 6/2018 | Kim et al. | | |
| 2018/0182303 A1* | 6/2018 | Jung | ........................ | G09G 3/3233 |
| 2018/0322833 A1* | 11/2018 | Zhang | ........................ | G09G 3/3607 |
| 2019/0066555 A1* | 2/2019 | Gu | ........................ | G09G 3/006 |
| 2019/0139470 A1* | 5/2019 | Yoo | ........................ | H04N 13/133 |
| 2019/0156786 A1* | 5/2019 | Aogaki | ........................ | G09G 5/10 |
| 2019/0191153 A1* | 6/2019 | Speigle | ........................ | G09G 5/10 |
| 2019/0213956 A1* | 7/2019 | Park | ........................ | G09G 3/3283 |
| 2020/0388219 A1* | 12/2020 | Meng | ........................ | G09G 3/3258 |
| 2021/0201744 A1* | 7/2021 | Park | ........................ | G09G 3/2003 |
| 2021/0225272 A1* | 7/2021 | Yang | ........................ | G09G 3/2074 |
| 2021/0312849 A1* | 10/2021 | Park | ........................ | G09G 3/006 |
| 2021/0335323 A1* | 10/2021 | Kajita | ........................ | G09G 5/10 |
| 2022/0059002 A1* | 2/2022 | Park | ........................ | G09G 3/3208 |

* cited by examiner

DISPLAY APPARATUS AND METHOD OF COMPENSATING IMAGE OF DISPLAY PANEL USING THE SAME

This application claims priority to Korean Patent Application No. 10-2020-0106426, filed on Aug. 24, 2020, and all the benefits accruing therefrom under 35 U.S.C. § 119, the content of which in its entirety is herein incorporated by reference.

BACKGROUND

1. Field

Embodiments of the invention relate to a display apparatus and a method of compensating an image of a display panel using the display apparatus. More particularly, embodiments of the invention relate to a display apparatus enhancing a compensation accuracy at a low grayscale range and a method of compensating an image of a display panel using the display apparatus.

2. Description of the Related Art

Generally, a display apparatus includes a display panel and a display panel driver. The display panel includes a plurality of gate lines, a plurality of data lines and a plurality of pixels. The display panel driver includes a gate driver and a data driver. The gate driver outputs gate signals to the gate lines, respectively, and the data driver outputs data voltages to the data lines, respectively.

The display apparatus may operate optical compensation including capturing an image of the display panel with a camera and compensating a stain of the display panel based on the captured image.

In addition, the display apparatus may operate an external compensation including receiving a sensing signal from the pixels and compensating a deviation of threshold voltages and a deviation of mobilities of switching elements of the pixels based on the sensing signal.

For the external compensation, the threshold voltage and the mobility may be obtained using a sensing value in a predetermined grayscale range and the external compensation may be operated by modeling the threshold voltages and the mobilities of the entire grayscale range based on the sensing value.

SUMMARY

When a predetermined grayscale range is a low grayscale range, a compensation accuracy in a high grayscale range may be decreased. When the predetermined grayscale range is the high grayscale range, a compensation accuracy in the low grayscale range may be decreased. In addition, for an optical compensation, it may take a substantial time, e.g., tens of seconds or more, to capture an image in the low grayscale range with the camera and the compensation accuracy in the low grayscale range may be decreased.

Embodiments of the invention provide a display apparatus capable of enhancing a compensation accuracy in a low grayscale range by combining an optical compensation method and an external compensation method.

Embodiments of the invention also provide a method of compensating an image of a display panel using the display apparatus.

In an embodiment of a display apparatus according to the invention, the display apparatus includes a first compensator, a second compensator and a display panel including pixels. The first compensator generates a first compensation coefficient based on sensing data of a pixel of the pixels for a first grayscale value, generates a second compensation coefficient based on camera imaging data for a second grayscale value greater than the first grayscale value and compensates image data based on the first compensation coefficient and the second compensation coefficient. The second compensator compensates the image data by modeling sensing data of entire grayscale range based on sensing data of the pixel for a third grayscale value and a fourth grayscale value. The display panel displays an image based on the image data compensated by the first compensator and the second compensator.

In an embodiment, at least one of the pixels of the display panel may include a first switching element including a control electrode connected to a first node, an input electrode which receives a first power voltage and an output electrode connected to a second node, a second switching element including a control electrode which receives a first switching signal, an input electrode which receives a data voltage and an output electrode connected to the first node, a third switching element including a control electrode which receives a second switching signal, an input electrode connected to the second node and an output electrode connected to a sensing line and a light emitting element including an anode electrode connected to the second node and a cathode electrode which receives a second power voltage.

In an embodiment, the display apparatus may further include a first switch which applies an initialization voltage to the sensing line or reads a sensing voltage through the sensing line in response to a third switching signal. In a sensing period, the first switching signal may have an active level, the second switching signal may have an active level and the third switching signal may have a first level for connecting the sensing line to a sensing circuit through the first switch.

In an embodiment, in an initialization period, the first switching signal may have an inactive level, the second switching signal may have the active level and the third switching signal may have a second level for applying the initialization voltage to the sensing line through the first switch.

In an embodiment, the sensing circuit may include an operator including a first input electrode which receives the sensing voltage and a second input electrode which receives a reference voltage and an output electrode, an analog digital converter connected to the output electrode of the operator, and a capacitor connected between the first input electrode of the operator and the output electrode of the operator.

In an embodiment, a sensing signal outputted from the output electrode of the operator may be a sensing current. When the data voltage applied to the second switching element is Vgs, the sensing current is I, a threshold voltage of the first switching element is Vth and a mobility of the first switching element is $J$, the sensing current may be determined as $I=\beta(Vgs-Vth)^2$.

In an embodiment, the sensing circuit may apply a first data voltage corresponding to the third grayscale value to the pixel, sense a first sensing current and apply a second data voltage corresponding to the fourth grayscale value to the pixel to sense a second sensing current. The second compensator may obtain the threshold voltage Vth of the first switching element and the mobility 3 of the first switching element using the first data voltage, the second data voltage, the first sensing current and the second sensing current.

In an embodiment, the third grayscale value and the fourth grayscale value may be greater than the first grayscale value.

In an embodiment, at least one of the pixels of the display panel may include a first switching element including a control electrode connected to a first node, an input electrode connected to an output electrode of a fourth switching element and an output electrode connected to a second node, a second switching element including a control electrode which receives a first switching signal, an input electrode which receives a data voltage and an output electrode connected to the first node, a third switching element including a control electrode which receives a second switching signal, an input electrode connected to the second node and an output electrode connected to a sensing line, the fourth switching element including a control electrode which receives a light emitting signal, an input electrode which receives a first power voltage and the output electrode connected to the input electrode of the first switching element and a light emitting element including an anode electrode connected to the second node and a cathode electrode which receives a second power voltage.

In an embodiment, the first switching element, the second switching element and the third switching element may be n-type transistors. The fourth switching element may be a p-type transistor.

In an embodiment, a compensation coefficient for a grayscale range between the first grayscale value and the second grayscale value may be generated by an interpolation of the first compensation coefficient and the second compensation coefficient.

In an embodiment, a compensation coefficient for a grayscale range less than the first grayscale value may be generated by an extrapolation of the first compensation coefficient and the second compensation coefficient. A compensation coefficient for a grayscale range greater than the second grayscale value may be generated by an extrapolation of the first compensation coefficient and the second compensation coefficient.

In an embodiment, the first compensator may generate a third compensation coefficient based on camera imaging data for a fifth grayscale value between the first grayscale value and the second grayscale value. The first compensator may compensate the image data using the first compensation coefficient, the second compensation coefficient and the third compensation coefficient.

In an embodiment, a compensation coefficient for a grayscale range between the first grayscale value and the fifth grayscale value may be generated by an interpolation of the first compensation coefficient and the third compensation coefficient. A compensation coefficient for a grayscale range between the fifth grayscale value and the second grayscale value may be generated by an interpolation of the third compensation coefficient and the second compensation coefficient. A compensation coefficient for a grayscale range less than the first grayscale value may be generated by an extrapolation of the first compensation coefficient and the third compensation coefficient. A compensation coefficient for a grayscale range greater than the second grayscale value may be generated by an extrapolation of the third compensation coefficient and the second compensation coefficient.

In an embodiment, the first compensator may generate a third compensation coefficient based on camera imaging data for a fifth grayscale value between the first grayscale value and the second grayscale value. The first compensator may generate a fourth compensation coefficient based on sensing data of the pixel for a sixth grayscale value less than the first grayscale value. The first compensator may compensate the image data using the first compensation coefficient, the second compensation coefficient, the third compensation coefficient and the fourth compensation coefficient.

In an embodiment, a compensation coefficient for a grayscale range between the sixth grayscale value and the first grayscale value may be generated by an interpolation of the fourth compensation coefficient and the first compensation coefficient. A compensation coefficient for a grayscale range between the first grayscale value and the fifth grayscale value may be generated by an interpolation of the first compensation coefficient and the third compensation coefficient. A compensation coefficient for a grayscale range between the fifth grayscale value and the second grayscale value may be generated by an interpolation of the third compensation coefficient and the second compensation coefficient. A compensation coefficient for a grayscale range less than the sixth grayscale value may be generated by an extrapolation of the fourth compensation coefficient and the first compensation coefficient. A compensation coefficient for a grayscale range greater than the second grayscale value may be generated by an extrapolation of the third compensation coefficient and the second compensation coefficient.

In an embodiment, the display apparatus may further include a memory which stores the first compensation coefficient, the second compensation coefficient and the sensing data. The first compensator may compensate the image data using the first compensation coefficient and the second compensation coefficient which are determined in a manufacturing operation of the display apparatus and stored in the memory. The second compensator may compensate the image data using the sensing data sensed in real time in at least one of a power-off period and a power-on period.

In an embodiment of a method of compensating an image of a display panel including pixels according to the invention, the method includes generating a first compensation coefficient based on sensing data of a pixel of the pixels for a first grayscale value, generating a second compensation coefficient based on camera imaging data for a second grayscale value greater than the first grayscale value, compensating image data based on the first compensation coefficient and the second compensation coefficient and compensating the image data by modeling sensing data of entire grayscale range based on sensing data of the pixel for a third grayscale value and a fourth grayscale value.

In an embodiment, at least one of the pixels of the display panel may include a first switching element including a control electrode connected to a first node, an input electrode which receives a first power voltage and an output electrode connected to a second node, a second switching element including a control electrode which receives a first switching signal, an input electrode which receives a data voltage and an output electrode connected to the first node, a third switching element including a control electrode which receives a second switching signal, an input electrode connected to the second node and an output electrode connected to a sensing line and a light emitting element including an anode electrode connected to the second node and a cathode electrode which receives a second power voltage. A sensing circuit connected to the sensing line may include an operator including a first input electrode which receives a sensing voltage and a second input electrode which receives a reference voltage and an output electrode connected to an analog digital converter and a capacitor connected between the first input electrode of the operator and the output electrode of the operator.

In an embodiment, the compensating the image data based on the first compensation coefficient and the second compensation coefficient may include compensating the image data using the first compensation coefficient and the second compensation coefficient which are determined in a manufacturing operation of the display apparatus and stored in a memory. The compensating the image data by modeling the sensing data of the entire grayscale range may include compensating the image data using the sensing data sensed in real time in at least one of a power-off period and a power-on period.

According to the display apparatus and the method of compensating the image of the display panel, the display apparatus may operate the optical compensation based on the sensing data of the pixel for the first grayscale value and the camera imaging data for the second grayscale value which is greater than the first grayscale value and may operate the external compensation by modeling the sensing data of the entire grayscale range based on the sensing data of the pixel for the third grayscale value and the fourth grayscale value. Thus, the compensation accuracy in the low grayscale range may be enhanced.

BRIEF DESCRIPTION OF THE DRAWINGS

The above and other features and advantages of the invention will become more apparent by describing in detailed embodiments thereof with reference to the accompanying drawings, in which.

DETAILED DESCRIPTION

Figure 1:
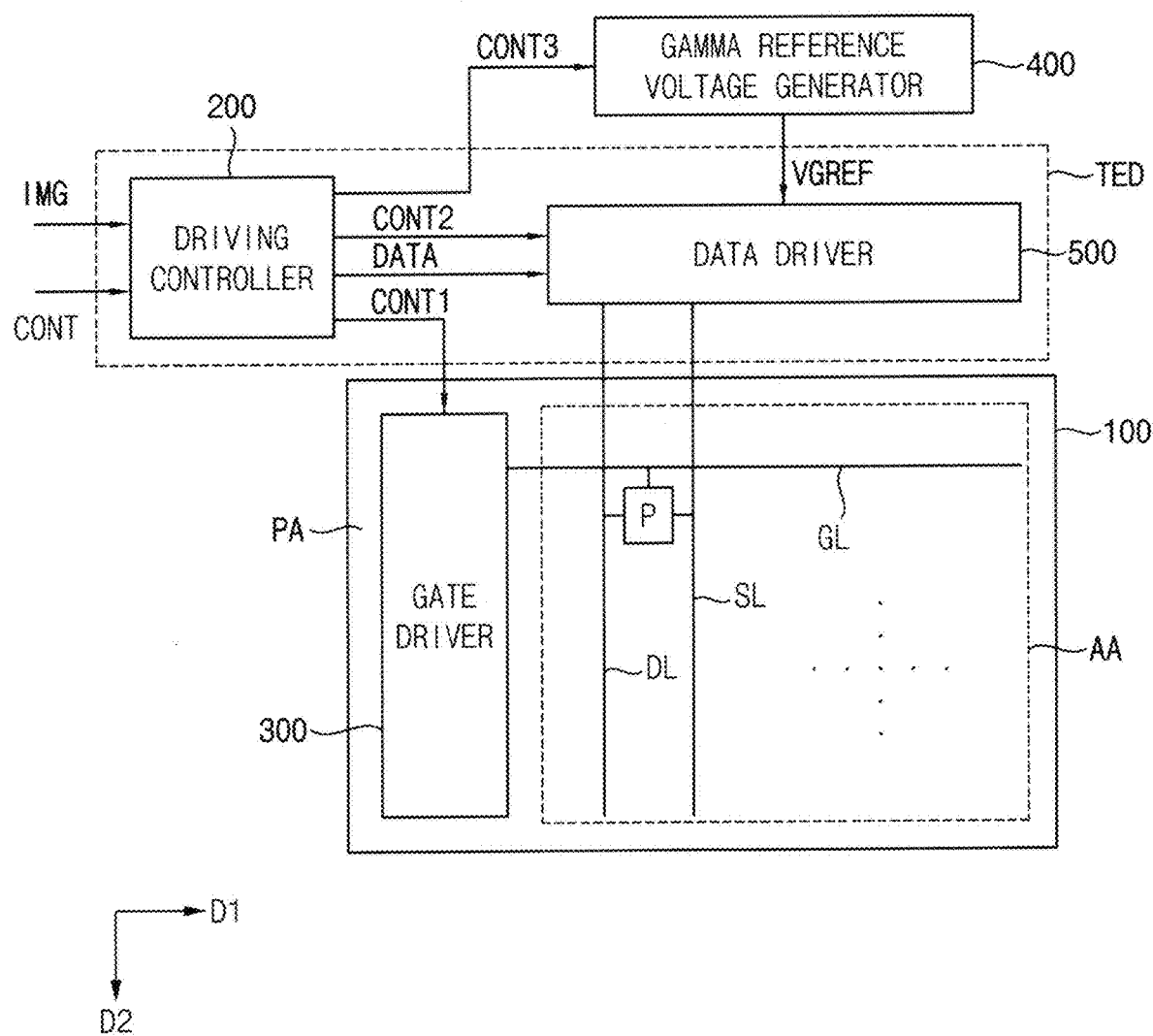
FIG. 1 is a block diagram illustrating an embodiment of a display apparatus according to the invention.

Hereinafter, the invention will be explained in detail with reference to the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a block diagram illustrating an embodiment of a display apparatus according to the invention.

Referring to FIG. 1, the display apparatus includes a display panel 100 and a display panel driver. The display panel driver includes a driving controller 200, a gate driver 300, a gamma reference voltage generator 400 and a data driver 500.

In an embodiment, the driving controller 200 and the data driver 500 may be unitary (e.g., integrated), for example. In an embodiment, the driving controller 200, the gamma reference voltage generator 400 and the data driver 500 may be unitary. A driving module including at least the driving controller 200 and the data driver 500 which are unitary may be referred to as a timing controller embedded data driver TED. The driving module including at least the driving controller 200 and the data driver 500 which are unitary may be referred to as an integrated driver TED.

The display panel 100 includes a display region AA on which an image is displayed and a peripheral region PA adjacent to the display region AA.

In an embodiment, in the illustrated embodiment, the display panel 100 may be an organic light emitting diode display panel including an organic light emitting diode, for example. In an alternative embodiment, the display panel 100 may be a liquid crystal display panel including a liquid crystal layer.

The display panel 100 includes a plurality of gate lines GL, a plurality of data lines DL and a plurality of pixels P connected to the gate lines GL and the data lines DL. The gate lines GL extend in a first direction D1 and the data lines DL extend in a second direction D2 crossing the first direction D1.

In the illustrated embodiment, the display panel 100 may further include a plurality of sensing lines SL connected to the pixels P. The sensing lines SL may extend in the second direction D2.

In the illustrated embodiment, the display panel driver may include a sensing circuit receiving sensing signals through the sensing lines SL from the pixel P of the display panel 100. The sensing circuit may be disposed in the data driver 500 or in the integrated driver TED. In an alternative embodiment, the sensing circuit may be provided independently from the data driver 500 and the integrated driver TED. In the invention may not be limited to a position of the sensing circuit.

The driving controller 200 receives input image data IMG and an input control signal CONT from an external apparatus. In an embodiment, the input image data IMG may include red image data, green image data and blue image data, for example. In an embodiment, the input image data IMG may include white image data, for example. In an embodiment, the input image data IMG may include magenta image data, yellow image data and cyan image data, for example. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3 and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may further include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The gate driver 300 generates gate signals driving the gate lines GL in response to the first control signal CONT1 received from the driving controller 200. The gate driver 300 outputs the gate signals to the gate lines GL. In an embodiment, the gate driver 300 may sequentially output the gate signals to the gate lines GL, for example.

In the illustrated embodiment, the gate driver 300 may be disposed (e.g., integrated) on the peripheral region PA of the display panel 100.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to a level of the data signal DATA.

In an embodiment, the gamma reference voltage generator 400 may be disposed in the driving controller 200, or in the data driver 500. In an embodiment, the gamma reference voltage generator 400 may be disposed in the integrated driver TED.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

Figure 2:
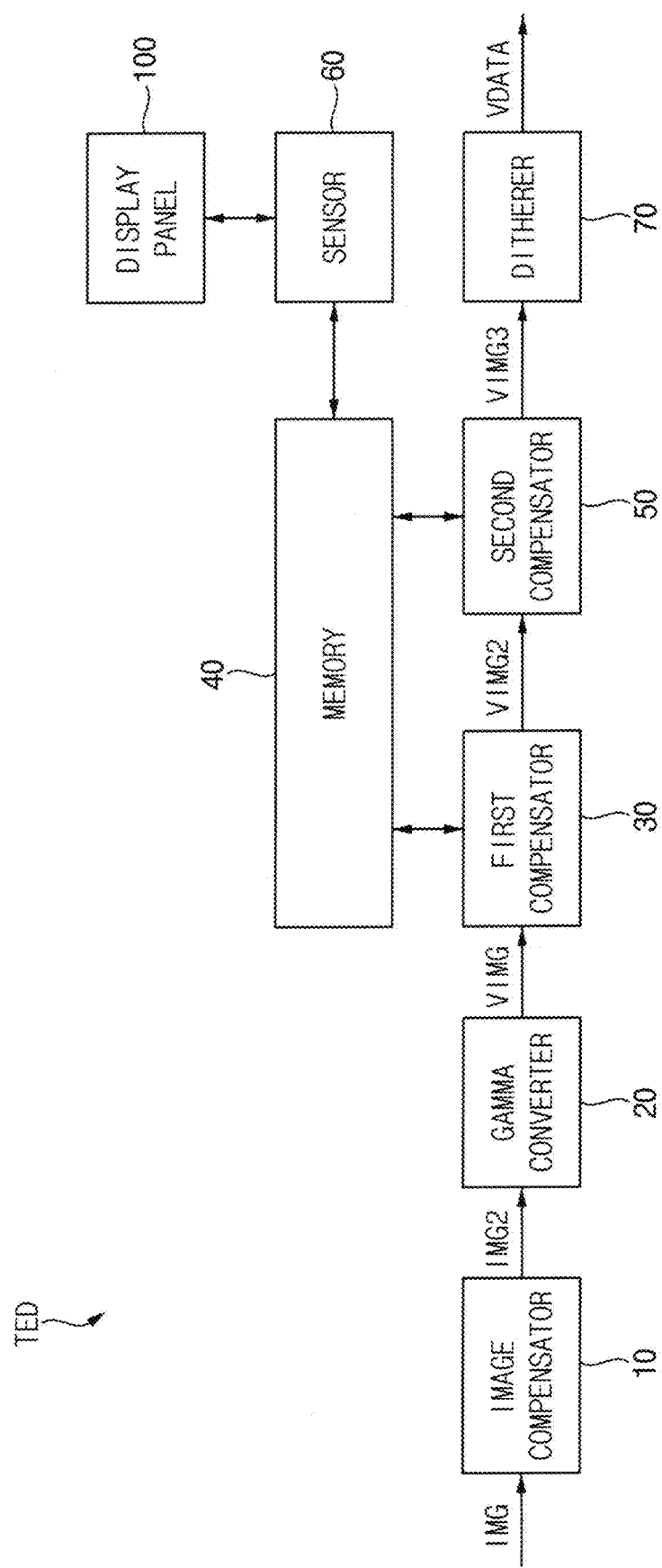
FIG. 2 is a block diagram illustrating an integrated driver of FIG. 1.

FIG. 2 is a block diagram illustrating the integrated driver TED of FIG. 1.

Referring to FIGS. 1 and 2, the integrated driver TED may include an image compensator 10, a gamma converter 20, a first compensator 30, a memory 40, a second compensator 50, a sensor 60 and a ditherer 70.

The image compensator 10 may receive the input image data IMG and operate an image quality compensation of the input image data IMG.

In an embodiment, the image compensator 10 may recognize a human skin in the input image data IMG and may compensate a skin tone, for example.

In addition, the image compensator 10 may compensate a dragging of a moving image by compensating grayscale data of a current frame data using previous frame data and the current frame data.

In addition, the image compensator 10 may operate an overdriving compensation. The overdriving compensation may enhance a charging rate of the pixel by increasing the grayscale value of the current frame data than a target grayscale value of the grayscale value of the current frame data.

In addition, the image compensator 10 may determine a degree of a deterioration of a light emitting element and may compensate the deterioration of the light emitting element.

In an embodiment, an output of the image compensator 10 may be second image data IMG2, for example.

The gamma converter 20 may receive the second image data IMG2 and may convert a gamma value of the second image data IMG2 using a predetermined gamma curve.

The input (e.g., second image data IMG2) of the gamma converter 20 may be a digital signal and an output of the gamma converter 20 may be an analog voltage VIMG. The output of the gamma converter 20 may be a first image voltage VIMG.

The first compensator 30 may receive the first image voltage VIMG. The first compensator 30 may generate a first compensation coefficient based on sensing data of the pixel for a first grayscale value, may generate a second compensation coefficient based on camera imaging data for a second grayscale value greater than the first grayscale value and may compensate the first image voltage VIMG using the first compensation coefficient and the second compensation coefficient. The output of the first compensator 30 may be a second image voltage VIMG2. The first compensator 30 may be a stain compensator for compensating luminance non-uniformity of the pixels of the display panel 100.

The second compensator 50 may receive the second image voltage VIMG2. The second compensator 50 may operate modeling of the sensing data of the entire grayscale range based on the sensing data of the pixel for a third grayscale value and a fourth grayscale value to compensate the second image voltage VIMG2. The output of the second compensator 50 may be a third image voltage VIMG3. The second compensator 50 may be an external compensator for compensating non-uniformity of the threshold voltages and the mobilities of the switching elements of the pixels of the display panel 100.

Although the first compensator 30 is disposed in front of the second compensator 50 in FIG. 2, the invention may not be limited thereto. In an embodiment, the second compensator 50 may be disposed in front of the first compensator 30, for example.

The memory 40 is connected to the first compensator 30 and the second compensator 50. The memory 40 may store values for the first compensator 30 and the second compensator 50. In an embodiment, the memory 40 may store the first compensation coefficient and the second compensation coefficient and the sensing data, for example.

The first compensator 30 may compensate the image data using the first compensation coefficient and the second compensation coefficient which are determined in a manufacturing operation of the display apparatus and stored in the memory 40. The first compensation coefficient and the second compensation coefficient may not be changed after being stored in the memory 40 in the manufacturing operation of the display apparatus.

The second compensator 50 may compensate the image data using the sensing data which are determined in the manufacturing operation of the display apparatus and stored in the memory 40. In addition, the second compensator 50 may compensate the image data using the sensing data sensed in real time in at least one of a power-off period and a power-on period. In addition, the second compensator 50 may also compensate the image data using the sensing data sensed in real time in a blank period during driving of the display apparatus except for the power-off period and the power-on period. The sensing data may be continuously updated after being stored in the memory 40 in the manufacturing operation of the display apparatus.

The sensor 60 may receive the sensing signal of the pixel from the display panel 100. The sensor 60 may receive the sensing signal through the sensing line SL of the display panel 100.

The integrated driver TED may operate the sensing data based on the sensing signal received from the sensor 60 and store the sensing data to the memory 40. The sensing data may be used for the compensation operation of the second compensator 50.

The ditherer 70 may receive the third image voltage VIMG3 form the second compensator 50. The ditherer 70 may operate dithering to reduce the number of bits of the third image voltage VIMG3. In an embodiment, the third image voltage VIMG3 may have a resolution of 12 bits, for example. In an embodiment, the data voltage VDATA which is the output of the ditherer 70 may have a resolution of 10 bits, for example.

In FIG. 2, the first compensator 30, the second compensator 50 and the ditherer 70 may be operated in the analog level. The output of the ditherer 70 may be the analog data voltage. In an alternative embodiment, the first compensator 30, the second compensator 50 and the ditherer 70 may be operated in the digital level. The output of the ditherer 70 may be the digital data voltage. Herein, when the output of the ditherer 70 is the digital data voltage, the display apparatus may include a digital to analog converter converting the output of the ditherer 70 to the analog level.

Figure 3:
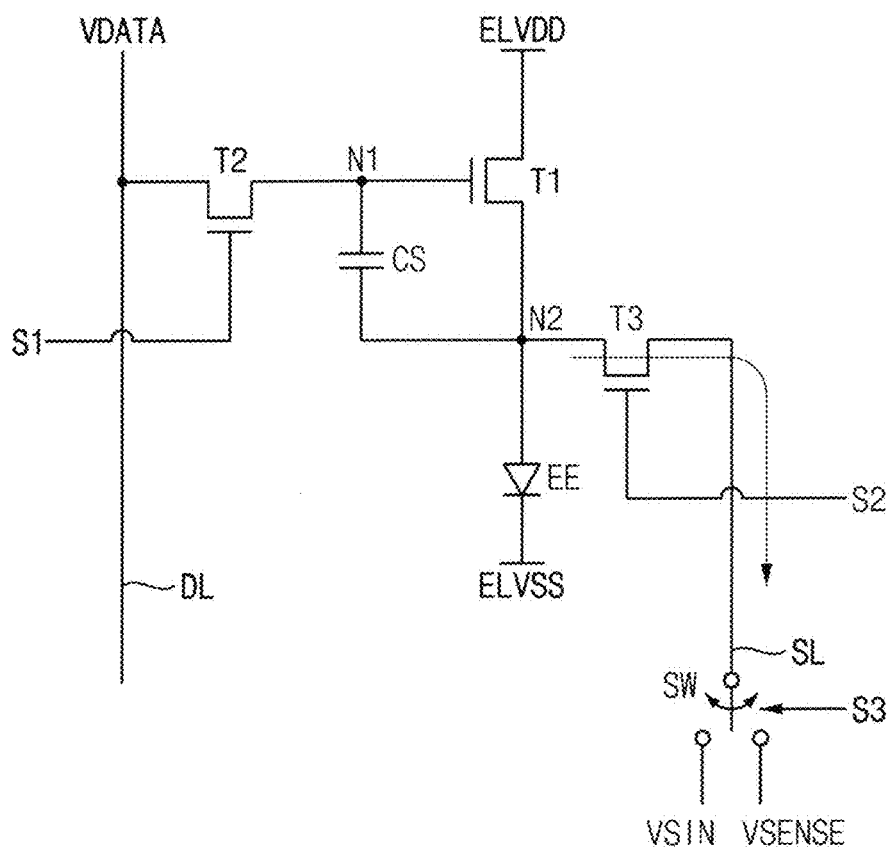
FIG. 3 is a circuit diagram illustrating a pixel of a display panel of FIG. 1.
Figure 4:
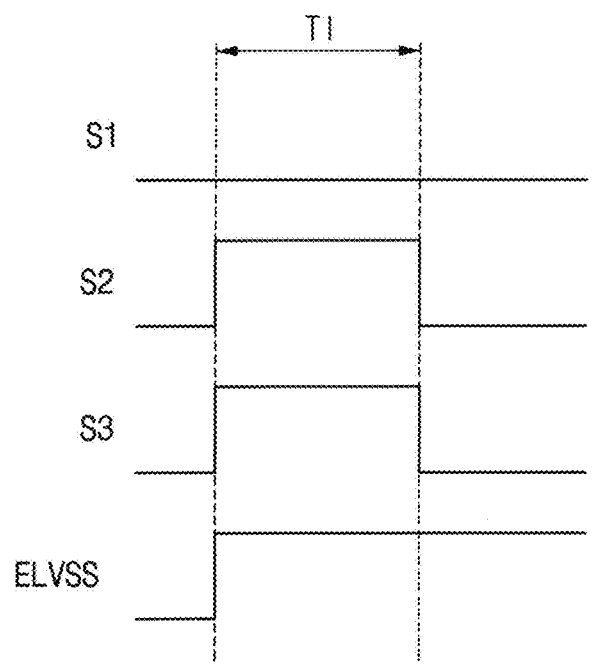
FIG. 4 is a timing diagram illustrating an input signal of the pixel of FIG. 3 in an initialization period.
Figure 5:
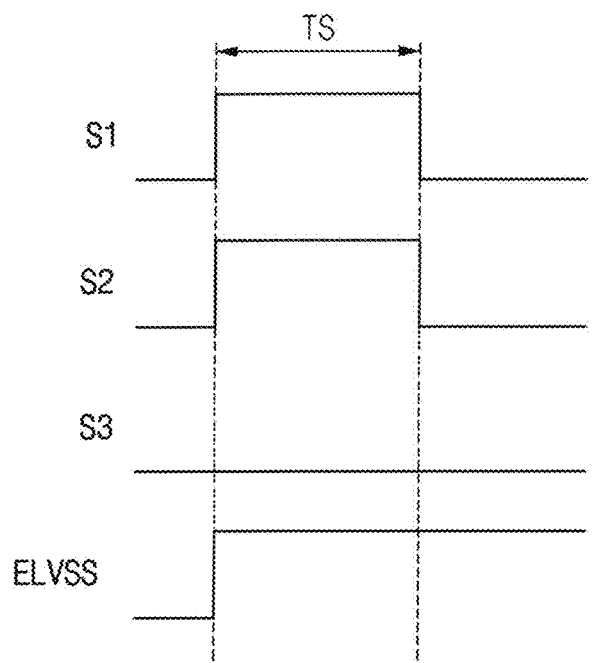
FIG. 5 is a timing diagram illustrating an input signal of the pixel of FIG. 3 in a sensing period.

FIG. 3 is a circuit diagram illustrating the pixel P of the display panel 100 of FIG. 1. FIG. 4 is a timing diagram illustrating an input signal of the pixel P of FIG. 3 in an initialization period. FIG. 5 is a timing diagram illustrating an input signal of the pixel P of FIG. 3 in a sensing period.

Referring to FIGS. 1 to 5, at least one of the pixels P may include a first switching element T1 applying a first power voltage ELVDD to a second node N2 in response to a signal at a first node N1, a second switching element T2 outputting the data voltage VDATA to the first node N1 in response to a first switching signal S1, a third switching element T3 outputting a signal at the second node N2 to a sensing node in response to a second switching signal S2, a storage capacitor CS including a first end portion connected to the first node N1 and a second end portion connected to the second node N2 and a light emitting element EE including a first electrode connected to the second node N2 and a second electrode receiving a second power voltage ELVSS.

In an embodiment, at least one of the pixels P may include the first switching element T1 including a control electrode connected to the first node N1, an input electrode receiving the first power voltage ELVDD and an output electrode connected to the second node N2, the second switching element T2 including a control electrode receiving the first switching signal S1, an input electrode receiving the data voltage VDATA and an output electrode connected to the first node N1, the third switching element T3 including a control electrode receiving the second switching signal S2, an input electrode connected to the second node N2 and an output electrode connected to the sensing line SL and the light emitting element EE including an anode electrode connected to the second node N2 and a cathode electrode receiving the second power voltage ELVSS, for example. In an embodiment, the first to third switching element T1 to T3 may be thin film transistors.

Herein, the second power voltage ELVSS may be less than the first power voltage ELVDD. In an embodiment, the light emitting element EE may be an organic light emitting diode, for example.

In an embodiment, the first switching element T1, the second switching element T2 and the third switching element T3 may be n-type transistors, for example.

The display apparatus may further include a first switch SW applying an initialization voltage VSIN to the sensing line SL or reading a sensing voltage VSENSE through the sensing line SL in response to a third switching signal S3. In the sensing period TS, the first switching signal S1 may have an active level, the second switching signal S2 may have an active level and the third switching signal S3 may have a first level (e.g., low level) for connecting the sensing line SL to the sensing circuit through the first switch SW.

In the initialization period TI, the first switching signal S1 may have an inactive level, the second switching signal S2 may have the active level and the third switching signal S3 may have a second level (e.g., high level) for applying the initialization voltage VSIN to the sensing line SL through the first switch SW.

As shown in FIG. 4, the first switching signal S1 is activated in the sensing period TS so that the data voltage VDATA may be applied to the first node N1 through the second switching element T2. Herein, the data voltage VDATA may be a sensing data voltage to sense a threshold voltage of the first switching element T1.

In the sensing period TS, the first switching element T1 may be turned on by the sensing data voltage applied to the first node and the initialization voltage VSIN which is already applied to the second node in the initialization period TI.

In addition, the second signal S2 is also activated in the sensing period TS so that the third switching element T3 is turned on and the voltage VSENSE at the second node N2 may be outputted to the sensing line SL through the third switching element T3 in the sensing period TS.

Figure 6:
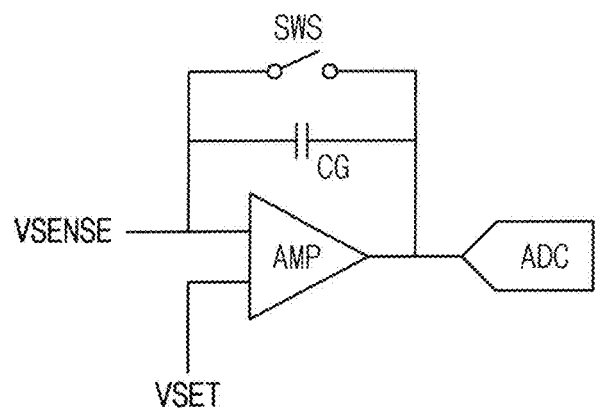
FIG. 6 is a circuit diagram illustrating a sensor of FIG. 2.

FIG. 6 is a circuit diagram illustrating the sensor 60 of FIG. 2.

Referring to FIGS. 1 to 6, the sensing line SL may be connected to the sensing circuit of the sensor 60. The sensing circuit may include an operator AMP including a first input electrode receiving the sensing voltage VSENSE and a second input electrode receiving a reference voltage VSET and an output electrode connected to an analog digital converter ADC and a capacitor CG connected between the first input electrode of the operator AMP and the output electrode of the operator AMP. The operator AMP may operate as an integrator. The sensing voltage VSENSE applied to the first input electrode may be outputted in a form of a sensing current from the output electrode.

The sensing circuit may further include a reset switch SWS connected between the first input electrode of the operator AMP and an output electrode of the operator AMP.

The analog to digital converter ADC may convert the sensing current outputted from the operator AMP to a digital sensing signal.

In the initialization period TI and the sensing period TS, the second power voltage ELVSS has the high level so that the pixel P may not emit light.

The integrated driver TED may operate in a writing mode and in a sensing mode. In the writing mode, the data voltage VDATA for displaying an image may be written in the pixels P of the display panel 100. In the sensing mode, the threshold voltages and the mobilities of the pixels P may be sensed from the pixels P. In the writing mode, the integrated driver TED may output the data voltage VDATA corresponding to the grayscale value of the input image data IMG to the data line DL. In contrast, in the sensing mode, the integrated driver TED may output the sensing data voltage for sensing the threshold voltage and the mobility of the first switching element T1 to the data line DL.

The sensing mode may be operated in a power-on period when the display apparatus starts to turn on, in a blank period between active periods when the image is written to the display panel 100 and in a power-off period when the display apparatus starts to turn off. The second compensator 50 of the integrated driver TED may compensate the data applied to the pixel P according to the sensed threshold voltage and the sensed mobility of the pixel P. The integrated driver TED may output the data voltage VDATA compensated based on the sensing signal to the data line DL in the active period.

FIGS. 7 to 11 are graphs illustrating an operation of the second compensator 50 of FIG. 2.

Figure 7:
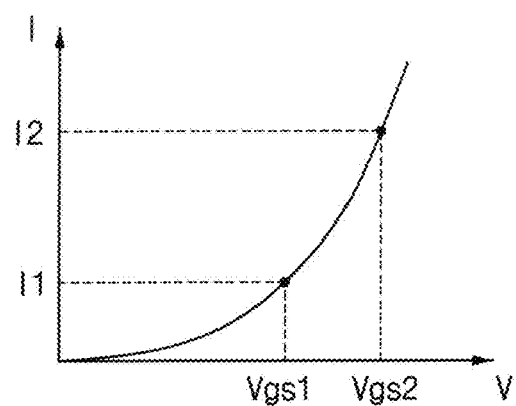
FIGS. 7 to 11 are graphs illustrating an operation of a second compensator of FIG. 2.

To obtain the threshold voltage and the mobility, the second compensator 50 may use a current-voltage curve of the first switching element T1 of the pixel P shown in FIG. 7. In FIG. 7, the voltage V may be a gate-source voltage Vgs of the first switching element T1 and the current I may be a source-drain current of the first switching element T1. For convenience of explanation, the gate-source voltage Vgs of the first switching element T1 may be assumed to be the data voltage VDATA applied to the second switching element T2.

When the data voltage applied to the second switching element T2 is Vgs, the sensing current is I, the threshold voltage of the first switching element T1 is Vth and the mobility of the first switching element T1 is J, the sensing current may be determined as a following Equation 1.

$$I=\beta(Vgs-VTh)^2 \qquad \text{[Equation 1]}$$

The sensing circuit may apply a third data voltage (e.g. Vgs1) corresponding to a third grayscale value to the pixel P, may sense a third sensing current (e.g. I1), may apply a fourth data voltage (e.g. Vgs2) corresponding to a fourth grayscale value to the pixel P, may sense a fourth sensing current (e.g. I2). In an embodiment, the sensing circuit may apply the third data voltage (e.g. Vgs1) corresponding to the third grayscale value to the pixel P and may sense the third sensing current (e.g. I1) in a first sensing frame and the sensing circuit may apply the fourth data voltage (e.g. Vgs2) corresponding to the fourth grayscale value to the pixel P, may sense the fourth sensing current (e.g. I2) in a second sensing frame adjacent to the first sensing frame, for example. In an alternative embodiment, the sensing circuit may sense the third sensing current (e.g. I1) in a first time and may sense the fourth sensing current (e.g. I2) in a second time different from the first time. Unknown values in Equation 1 are the threshold voltage Vth of the first switching element T1 and the mobility 3 of the first switching element T1. When the data voltages of the two grayscale values (e.g. the third grayscale value and the fourth grayscale value) are applied and the sensing currents are sensed for the two grayscale values, the two unknown values Vth and 3 may be obtained.

The second compensator 50 may obtain the threshold voltage Vth of the first switching element T1 and the mobility 3 of the first switching element T1 using the third data voltage, the fourth data voltage, the third sensing current and the fourth sensing current.

In an embodiment, the sensing circuit may be connected to all of the pixels of the display panel 100 so that the second compensator 50 may obtain Vth and 3 in a unit of the pixel, for example.

Figure 8:
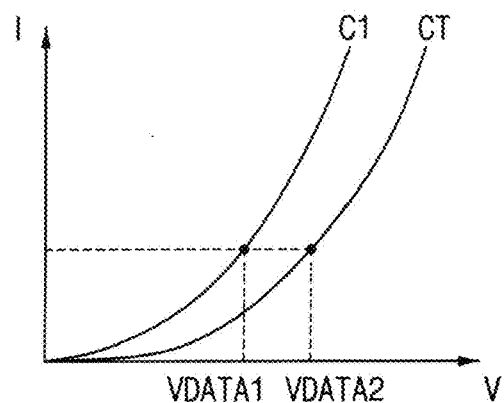

In FIG. 8, a first curve C1 may be a current-voltage curve of a first pixel and a second curve CT may be a current-voltage curve of a target pixel. The second compensator 50 may compensate the input data voltage VDATA1 of the first pixel to the compensated data voltage VDATA2 such that the current due to the input data voltage VDATA1 of the first pixel matches the current of the target pixel.

As explained above, the second compensator 50 may sense the sensing currents at two sensing points (two sensing grayscale values) to obtain the threshold voltage Vth of the first switching element T1 and the mobility 3 of the first switching element T1. The threshold voltage Vth and the mobility 3 may be obtained using the sensing currents for the two sensing grayscale values and the current-voltage curve C1 for each pixel may be obtained as shown in FIG. 8.

Figure 9:
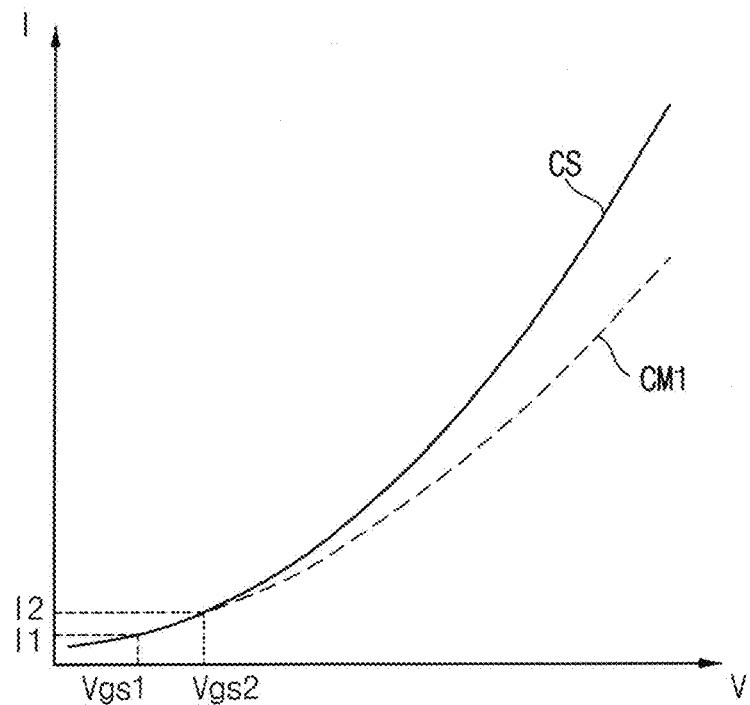

In FIG. 9, for example, the two sensing points Vgs1 and Vgs2 may be set in the low grayscale range. A curve CM1 represents a result of modeling the entire grayscale range using two sensing points Vgs1 and Vgs2 and a curve CS represents a sensing current curve CS which is actually measured for the entire grayscale range. When the image data are compensated using the curve CS, the most accurate compensation result may be obtained. However, when the sensing currents for the entire grayscale range are sensed and stored in the memory 40, the load of the memory 40 may greatly increase so that this method may be practically impossible.

Thus, the second compensator 50 may compensate the image using a curve CM1 obtained by modeling the entire grayscale range using the threshold voltage Vth and the mobility 3 obtained for the two sensing points Vgs1 and Vgs2.

As shown in FIG. 9, when the two sensing points Vgs1 and Vgs2 are set in the low grayscale range, the difference between the curve CM1 and the curve CS occurs and this difference causes a compensation error of the second compensator 50.

Figure 10:
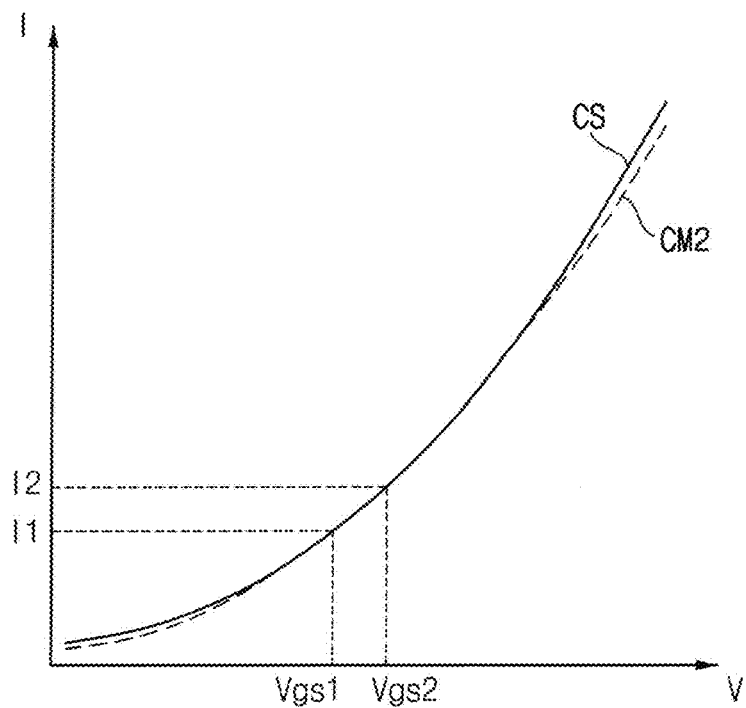

In FIG. 10, for example, the two sensing points Vgs1 and Vgs2 may be set in the middle grayscale range. A curve CM2 represents a result of modeling the entire grayscale range using two sensing points Vgs1 and Vgs2 and a curve CS represents a sensing current curve CS which is actually measured for the entire grayscale range.

As shown in FIG. 10, when the two sensing points Vgs1 and Vgs2 are set in the middle grayscale range, the compensation error may be less than the compensation error in FIG. 9. However, the compensation error may be still generated in the low grayscale range and in the high grayscale range. Although the compensation error in the high grayscale range may not be easily shown to a user, the compensation error in the low grayscale range may be easily shown to the user.

Figure 11:
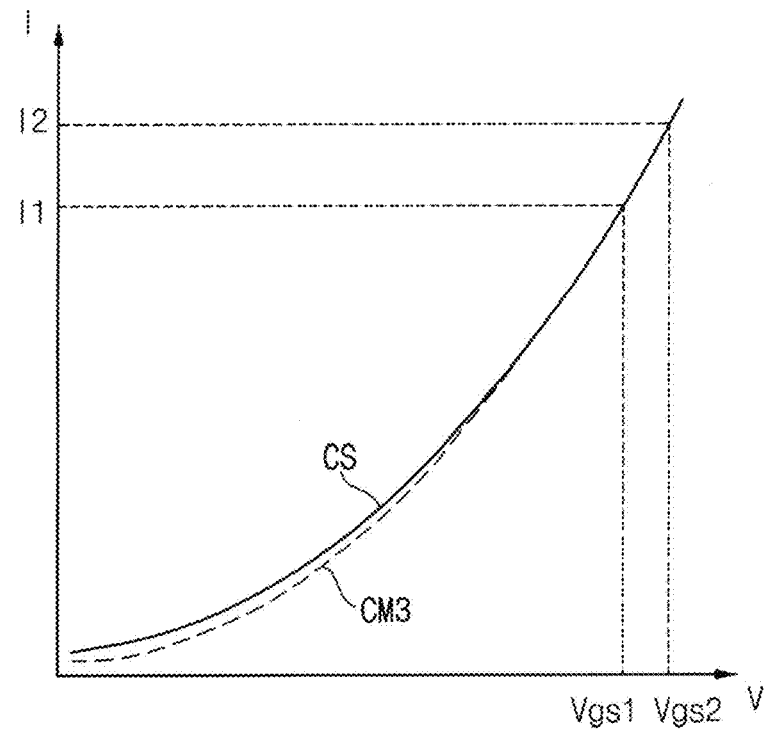

In FIG. 11, for example, the two sensing points Vgs1 and Vgs2 may be set in the high grayscale range. A curve CM3 represents a result of modeling the entire grayscale range using two sensing points Vgs1 and Vgs2 and a curve CS represents a sensing current curve CS which is actually measured for the entire grayscale range.

As shown in FIG. 11, when the two sensing points Vgs1 and Vgs2 are set in the high grayscale range, the compensation error may be substantially great in the low grayscale range. As explained above, the compensation error in the low grayscale range may be easily shown to the user.

In the illustrated embodiment, the two sensing points Vgs1 and Vgs2 may be set in the middle grayscale range as FIG. 10. In an embodiment, the third grayscale value and the fourth grayscale value which are the two sensing points used by the second compensator 50 may be greater than the first grayscale value used by the first compensator 30, for example.

Figure 12:
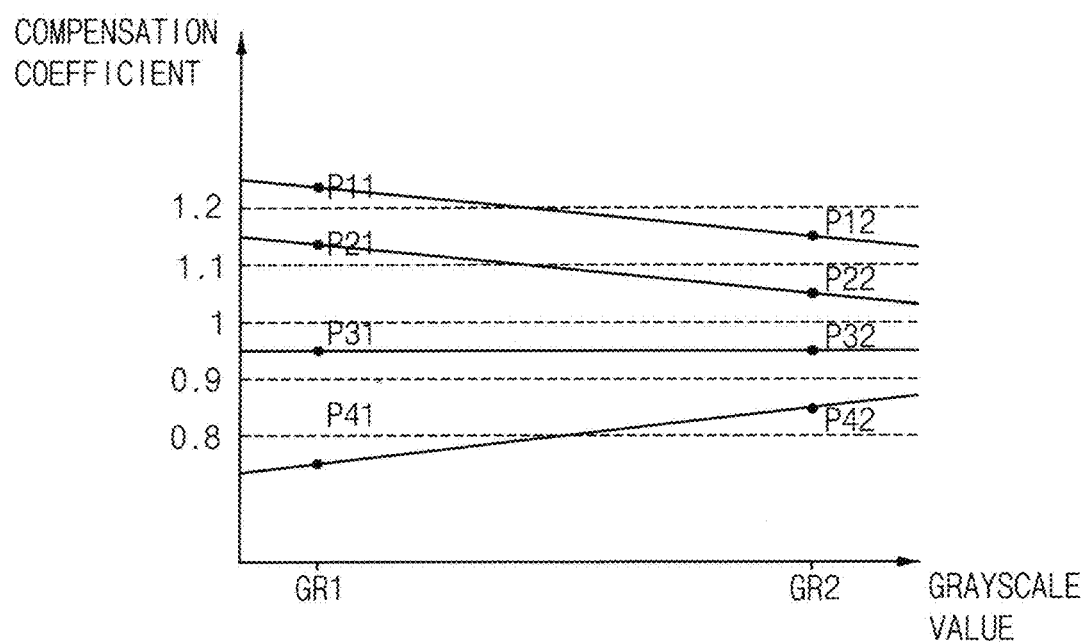
FIG. 12 is a graph illustrating an operation of a first compensator of FIG. 2.

FIG. 12 is a graph illustrating an operation of the first compensator 30 of FIG. 2.

Referring to FIGS. 1 to 12, the first compensator 30 may generate the first compensation coefficient based on the sensing data of the pixel P for the first grayscale value GR1, may generate the second compensation coefficient based on the camera imaging data for the second grayscale value GR2 greater than the first grayscale value GR1 and may compensate the image data using the first compensation coefficient and the second compensation coefficient. As described above, the accuracy of the camera imaging data at the low grayscale range is low, so that the first compensator 30 may generate the first compensation coefficient using the sensing current of the sensing circuit at the low grayscale range (e.g. the first grayscale value GR1).

In FIG. 12, when the first compensation coefficient is 1, the input luminance may be close to the target luminance. When the first compensation coefficient is greater than 1, the input luminance may be lower than the target luminance so that the input luminance may be compensated to be increased. When the first compensation coefficient is less than 1, the input luminance may be greater than the target luminance so that the input luminance may be compensated to be decreased.

In the illustrated embodiment, the compensation coefficient for a grayscale range between the first grayscale value GR1 and the second grayscale value GR2 may be generated by an interpolation of the first compensation coefficient and the second compensation coefficient.

The compensation coefficient for a grayscale range less than the first grayscale value GR1 may be generated by an extrapolation of the first compensation coefficient and the second compensation coefficient. The compensation coefficient for a grayscale range greater than the second grayscale value GR2 may be generated by an extrapolation of the first compensation coefficient and the second compensation coefficient.

In FIG. 12, P11 and P12 respectively represent the first compensation coefficient and the second compensation coefficient of a first pixel, P21 and P22 respectively represent the first compensation coefficient and the second compensation coefficient of a second pixel, P31 and P32 respectively represent the first compensation coefficient and the second compensation coefficient of a third pixel and P41 and P42 respectively represent the first compensation coefficient and the second compensation coefficient of a fourth pixel.

In the illustrated embodiment, for example, the first compensator 30 may generate the compensation coefficients using the sensing data for one grayscale value GR1 and the camera imaging data for one grayscale value GR2.

In the illustrated embodiment, the first compensator 30 may generate the compensation coefficients using the sensing data for one grayscale value GR1 and the camera imaging data for one grayscale value GR2 regardless of the color of the pixel for convenience of explanation. In an embodiment, the first compensator 30 may generate a first color compensation coefficients using the sensing data for one grayscale value GR1 and the camera imaging data for one grayscale value GR2 for a first color subpixel, the first compensator 30 may generate a second color compensation coefficients using the sensing data for one grayscale value GR1 and the camera imaging data for one grayscale value GR2 for a second color subpixel and the first compensator 30 may generate a third color compensation coefficients using the sensing data for one grayscale value GR1 and the camera imaging data for one grayscale value GR2 for a third color subpixel, for example. In an alternative embodiment, the grayscale value where the sensing data is obtained and the grayscale value where the camera imaging data is obtained may be varied according to the color of the pixel.

In the illustrated embodiment, the display apparatus may operate the optical compensation based on the sensing data of the pixel for the first grayscale value GR1 and the camera imaging data for the second grayscale value GR2 which is greater than the first grayscale value GR1 and may operate the external compensation by modeling the sensing data of the entire grayscale range based on the sensing data of the pixel for the third grayscale value (corresponding to Vgs1) and the fourth grayscale value (corresponding to Vgs2). Thus, the compensation accuracy in the low grayscale range may be enhanced.

Figure 13:
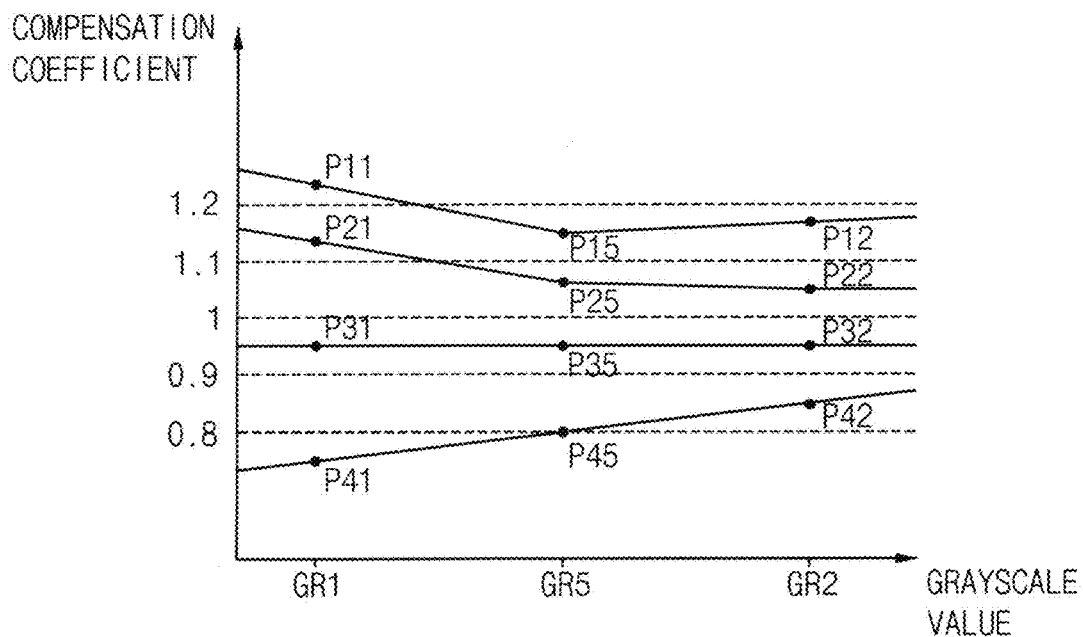
FIG. 13 is a graph illustrating an embodiment of an operation of a first compensator of a display apparatus according to the invention.

FIG. 13 is a graph illustrating an embodiment of an operation of a first compensator of a display apparatus according to the invention.

The display apparatus in the illustrated embodiment is substantially the same as the display apparatus of the previous embodiment explained referring to FIGS. 1 to 12 except for the number of the compensation grayscale values. Thus, the same reference numerals will be used to refer to the same or like parts as those described in the previous embodiment of FIGS. 1 to 12 and any repetitive explanation concerning the above elements will be omitted.

Referring to FIG. 13, the first compensator 30 may generate a first compensation coefficient based on sensing data of a pixel P for a first grayscale value GR1, may generate a second compensation coefficient based on camera imaging data for a second grayscale value GR2 greater than the first grayscale value GR1, may generate a fifth compensation coefficient based on camera imaging data for a fifth grayscale value GR5 between the first grayscale value GR1 and the second grayscale value GR2 and may compensate the image data using the first compensation coefficient, the second compensation coefficient and the fifth compensation coefficient. As described above, the accuracy of the camera imaging data at the low grayscale range is low, so that the first compensator 30 may generate the first compensation coefficient using the sensing current of the sensing circuit at the low grayscale range (e.g. the first grayscale value GR1).

In the illustrated embodiment, the compensation coefficient for a grayscale range between the first grayscale value GR1 and the fifth grayscale value GR5 may be generated by an interpolation of the first compensation coefficient and the fifth compensation coefficient. The compensation coefficient for a grayscale range between the fifth grayscale value GR5 and the second grayscale value GR2 may be generated by an interpolation of the fifth compensation coefficient and the second compensation coefficient. The compensation coefficient for a grayscale range less than the first grayscale value GR1 may be generated by an extrapolation of the first compensation coefficient and the fifth compensation coefficient. The compensation coefficient for a grayscale range greater than the second grayscale value GR2 may be generated by an extrapolation of the fifth compensation coefficient and the second compensation coefficient.

In FIG. 13, P11, P15 and P12 respectively represent the first compensation coefficient, the fifth compensation coefficient and the second compensation coefficient of a first pixel, P21, P25 and P22 respectively represent the first compensation coefficient, the fifth compensation coefficient and the second compensation coefficient of a second pixel, P31, P35 and P32 respectively represent the first compensation coefficient, the fifth compensation coefficient and the second compensation coefficient of a third pixel and P41, P45 and P42 respectively represent the first compensation coefficient, the fifth compensation coefficient and the second compensation coefficient of a fourth pixel.

In the illustrated embodiment, for example, the first compensator 30 may generate the compensation coefficients using the sensing data for one grayscale value GR1 and the camera imaging data for two grayscale values GR5 and GR2.

In the illustrated embodiment, the display apparatus may operate the optical compensation based on the sensing data of the pixel for the first grayscale value GR1 and the camera imaging data for the fifth grayscale value GR5 and the second grayscale value GR2 which are greater than the first grayscale value GR1 and may operate the external compensation by modeling the sensing data of the entire grayscale range based on the sensing data of the pixel for the third grayscale value (corresponding to Vgs1) and the fourth grayscale value (corresponding to Vgs2). Thus, the compensation accuracy in the low grayscale range may be enhanced.

Figure 14:
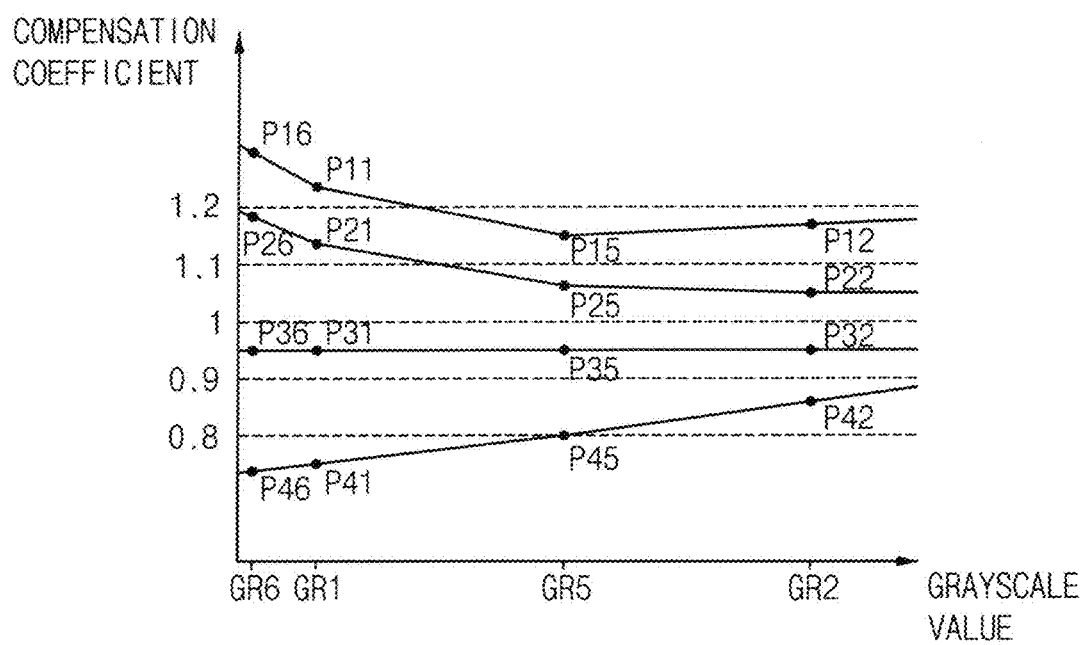
FIG. 14 is a graph illustrating an embodiment of an operation of a first compensator of a display apparatus according to the invention.

FIG. 14 is a graph illustrating an embodiment of an operation of a first compensator of a display apparatus according to the invention.

The display apparatus in the illustrated embodiment is substantially the same as the display apparatus of the previous embodiment explained referring to FIGS. 1 to 12 except for the number of the compensation grayscale values. Thus, the same reference numerals will be used to refer to the same or like parts as those described in the previous embodiment of FIGS. 1 to 12 and any repetitive explanation concerning the above elements will be omitted.

Referring to FIG. 14, the first compensator 30 may generate a first compensation coefficient based on sensing data of a pixel P for a first grayscale value GR1, may generate a second compensation coefficient based on camera imaging data for a second grayscale value GR2 greater than the first grayscale value GR1, may generate a fifth compensation coefficient based on camera imaging data for a fifth grayscale value GR5 between the first grayscale value GR1 and the second grayscale value GR2, may generate a sixth compensation coefficient based on sensing data of the pixel P for a sixth grayscale value GR6 less than the first grayscale value GR1 and may compensate the image data using the first compensation coefficient, the second compensation coefficient, the fifth compensation coefficient and the sixth compensation coefficient. As described above, the accuracy of the camera imaging data at the low grayscale range is low, so that the first compensator 30 may generate the first compensation coefficient using the sensing current of the sensing circuit at the low grayscale range (e.g. the sixth grayscale value GR6 and the first grayscale value GR1).

In the illustrated embodiment, the compensation coefficient for a grayscale range between the sixth grayscale value GR6 and the first grayscale value GR1 may be generated by an interpolation of the sixth compensation coefficient and the first compensation coefficient. The compensation coefficient for a grayscale range between the first grayscale value GR1 and the fifth grayscale value GR5 may be generated by an interpolation of the first compensation coefficient and the fifth compensation coefficient. The compensation coefficient for a grayscale range between the fifth grayscale value GR5 and the second grayscale value GR2 may be generated by an interpolation of the fifth compensation coefficient and the second compensation coefficient. The compensation coefficient for a grayscale range less than the sixth grayscale value GR6 may be generated by an extrapolation of the sixth compensation coefficient and the first compensation coefficient. The compensation coefficient for a grayscale range greater than the second grayscale value GR2 may be generated by an extrapolation of the fifth compensation coefficient and the second compensation coefficient.

In FIG. 14, P16, P11, P15 and P12 respectively represent the sixth compensation coefficient, the first compensation coefficient, the fifth compensation coefficient and the second compensation coefficient of a first pixel, P26, P21, P25 and P22 respectively represent the sixth compensation coefficient, the first compensation coefficient, the fifth compensation coefficient and the second compensation coefficient of a second pixel, P36, P31, P35 and P32 respectively represent the sixth compensation coefficient, the first compensation coefficient, the fifth compensation coefficient and the second compensation coefficient of a third pixel and P46, P41, P45 and P42 respectively represent the sixth compensation coefficient, the first compensation coefficient, the fifth compensation coefficient and the second compensation coefficient of a fourth pixel.

In the illustrated embodiment, for example, the first compensator 30 may generate the compensation coefficients using the sensing data for two grayscale values GR6 and GR1 and the camera imaging data for two grayscale values GR5 and GR2.

In the illustrated embodiment, the display apparatus may operate the optical compensation based on the sensing data of the pixel for the sixth grayscale value GR6 and the first grayscale value GR1 and the camera imaging data for the fifth grayscale value GR5 and the second grayscale value GR2 which are greater than the first grayscale value GR1 and may operate the external compensation by modeling the sensing data of the entire grayscale range based on the sensing data of the pixel for the third grayscale value (corresponding to Vgs1) and the fourth grayscale value (corresponding to Vgs2). Thus, the compensation accuracy in the low grayscale range may be enhanced.

Figure 15:
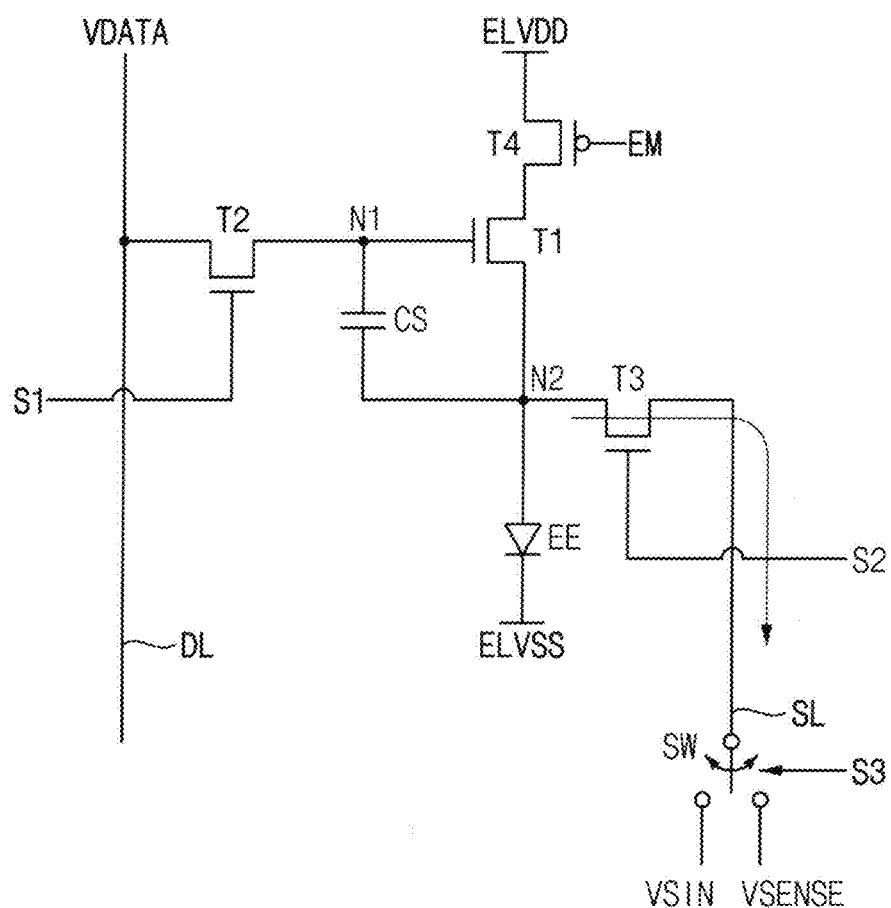
FIG. 15 is a circuit diagram illustrating an embodiment of a pixel of a display panel of a display apparatus according to the invention.

FIG. 15 is a circuit diagram illustrating an embodiment of a pixel of a display panel of a display apparatus according to the invention.

The display apparatus in the illustrated embodiment is substantially the same as the display apparatus of the previous embodiment explained referring to FIGS. 1 to 12 except for the pixel of the display panel. Thus, the same reference numerals will be used to refer to the same or like parts as those described in the previous embodiment of FIGS. 1 to 12 and any repetitive explanation concerning the above elements will be omitted.

Referring to FIG. 15, at least one of the pixels P of the display panel 100 may include a first switching element T1 including a control electrode connected to a first node N1, an input electrode connected to an output electrode of a fourth switching element T4 and an output electrode connected to a second node N2, a second switching element T2 including a control electrode receiving a first switching signal S1, an input electrode receiving a data voltage VDATA and an output electrode connected to the first node N1, a third switching element T3 including a control electrode receiving a second switching signal S2, an input electrode connected to the second node N2 and an output electrode connected to a sensing line SL, the fourth switching element T4 including a control electrode receiving a light emitting signal EM, an input electrode receiving a first power voltage ELVDD and the output electrode connected to the input electrode of the first switching element T1 and a light emitting element EE including an anode electrode connected to the second node N2 and a cathode electrode receiving a second power voltage ELVSS.

In an embodiment, the first switching element T1, the second switching element T2 and the third switching element T3 may be n-type transistors, for example. In the embodiment, the fourth switching element T4 may be a p-type transistor, for example.

The display apparatus may further include a first switch SW applying an initialization voltage VSIN to the sensing line SL or reading a sensing voltage VSENSE through the sensing line SL in response to a third switching signal S3.

In the illustrated embodiment, the display apparatus may operate the optical compensation based on the sensing data of the pixel for the first grayscale value GR1 and the camera imaging data for the second grayscale value GR2 which is greater than the first grayscale value GR1 and may operate the external compensation by modeling the sensing data of the entire grayscale range based on the sensing data of the pixel for the third grayscale value (corresponding to Vgs1) and the fourth grayscale value (corresponding to Vgs2). Thus, the compensation accuracy in the low grayscale range may be enhanced.

In the illustrated embodiment, the display quality of the display panel 100 may be enhanced.

The foregoing is illustrative of the invention and is not to be construed as limiting thereof. Although embodiments of the invention have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of the invention and is not to be construed as limited to the predetermined embodiments disclosed, and that modifications to the disclosed embodiments, as well as other embodiments, are intended to be included within the scope of the appended claims.

What is claimed is:

1. A display apparatus comprising:
 a display panel including pixels;
 a first compensator which generates a first compensation coefficient based on sensing data of a pixel of the pixels for a first grayscale value, generates a second compensation coefficient based on camera imaging data for a second grayscale value greater than the first grayscale value and compensates image data based on the first compensation coefficient and the second compensation coefficient; and a second compensator which compensates the image data by modeling sensing data of entire grayscale range based on sensing data of the pixel for a third grayscale value and a fourth grayscale value,
wherein the display panel displays an image based on the image data compensated by the first compensator and the second compensator.

2. The display apparatus of claim 1, wherein at least one of the pixels of the display panel comprises:
a first switching element including a control electrode connected to a first node, an input electrode which receives a first power voltage and an output electrode connected to a second node;
a second switching element including a control electrode which receives a first switching signal, an input electrode which receives a data voltage and an output electrode connected to the first node;
a third switching element including a control electrode which receives a second switching signal, an input electrode connected to the second node and an output electrode connected to a sensing line; and
a light emitting element including an anode electrode connected to the second node and a cathode electrode which receives a second power voltage.

3. The display apparatus of claim 2, further comprising a first switch which applies an initialization voltage to the sensing line or reads a sensing voltage through the sensing line in response to a third switching signal,
wherein, in a sensing period, the first switching signal has an active level, the second switching signal has an active level and the third switching signal has a first level for connecting the sensing line to a sensing circuit through the first switch.

4. The display apparatus of claim 3, wherein, in an initialization period, the first switching signal has an inactive level, the second switching signal has the active level and the third switching signal has a second level for applying the initialization voltage to the sensing line through the first switch.

5. The display apparatus of claim 3, wherein the sensing circuit comprises:
an operator including a first input electrode which receives the sensing voltage and a second input electrode which receives a reference voltage and an output electrode;
an analog digital converter connected to the output electrode of the operator; and
a capacitor connected between the first input electrode of the operator and the output electrode of the operator.

6. The display apparatus of claim 5, wherein a sensing signal outputted from the output electrode of the operator is a sensing current, and
wherein when the data voltage applied to the second switching element is Vgs, the sensing current is I, a threshold voltage of the first switching element is Vth and a mobility of the first switching element is $\beta$, the sensing current is determined as $I=\beta(Vgs-Vth)^2$.

7. The display apparatus of claim 6, wherein the sensing circuit applies a first data voltage corresponding to the third grayscale value to the pixel, senses a first sensing current and applies a second data voltage corresponding to the fourth grayscale value to the pixel to sense a second sensing current, and
wherein the second compensator obtains the threshold voltage Vth of the first switching element and the mobility $\beta$ of the first switching element using the first data voltage, the second data voltage, the first sensing current and the second sensing current.

8. The display apparatus of claim 7, wherein the third grayscale value and the fourth grayscale value are greater than the first grayscale value.

9. The display apparatus of claim 1, wherein at least one of the pixels of the display panel comprises:
a first switching element including a control electrode connected to a first node, an input electrode connected to an output electrode of a fourth switching element and an output electrode connected to a second node;
a second switching element including a control electrode which receives a first switching signal, an input electrode which receives a data voltage and an output electrode connected to the first node;
a third switching element including a control electrode which receives a second switching signal, an input electrode connected to the second node and an output electrode connected to a sensing line;
the fourth switching element including a control electrode which receives a light emitting signal, an input electrode which receives a first power voltage and the output electrode connected to the input electrode of the first switching element; and
a light emitting element including an anode electrode connected to the second node and a cathode electrode which receives a second power voltage.

10. The display apparatus of claim 9, wherein the first switching element, the second switching element and the third switching element are n-type transistors, and
wherein the fourth switching element is a p-type transistor.

11. The display apparatus of claim 1, wherein a compensation coefficient for a grayscale range between the first grayscale value and the second grayscale value is generated by an interpolation of the first compensation coefficient and the second compensation coefficient.

12. The display apparatus of claim 11, wherein a compensation coefficient for a grayscale range less than the first grayscale value is generated by an extrapolation of the first compensation coefficient and the second compensation coefficient, and
wherein a compensation coefficient for a grayscale range greater than the second grayscale value is generated by an extrapolation of the first compensation coefficient and the second compensation coefficient.

13. The display apparatus of claim 1, wherein the first compensator generates a third compensation coefficient based on camera imaging data for a fifth grayscale value between the first grayscale value and the second grayscale value, and
wherein the first compensator compensates the image data using the first compensation coefficient, the second compensation coefficient and the third compensation coefficient.

14. The display apparatus of claim 13, wherein a compensation coefficient for a grayscale range between the first grayscale value and the fifth grayscale value is generated by an interpolation of the first compensation coefficient and the third compensation coefficient,
wherein a compensation coefficient for a grayscale range between the fifth grayscale value and the second grayscale value is generated by an interpolation of the third compensation coefficient and the second compensation coefficient,
wherein a compensation coefficient for a grayscale range less than the first grayscale value is generated by an extrapolation of the first compensation coefficient and the third compensation coefficient, and wherein a compensation coefficient for a grayscale range greater than the second grayscale value is generated by an extrapolation of the third compensation coefficient and the second compensation coefficient.

15. The display apparatus of claim 1, wherein the first compensator generates a third compensation coefficient based on camera imaging data for a fifth grayscale value between the first grayscale value and the second grayscale value, wherein the first compensator generates a fourth compensation coefficient based on sensing data of the pixel for a sixth grayscale value less than the first grayscale value, and wherein the first compensator compensates the image data using the first compensation coefficient, the second compensation coefficient, the third compensation coefficient and the fourth compensation coefficient.

16. The display apparatus of claim 15, wherein a compensation coefficient for a grayscale range between the sixth grayscale value and the first grayscale value is generated by an interpolation of the fourth compensation coefficient and the first compensation coefficient, wherein a compensation coefficient for a grayscale range between the first grayscale value and the fifth grayscale value is generated by an interpolation of the first compensation coefficient and the third compensation coefficient, wherein a compensation coefficient for a grayscale range between the fifth grayscale value and the second grayscale value is generated by an interpolation of the third compensation coefficient and the second compensation coefficient, wherein a compensation coefficient for a grayscale range less than the sixth grayscale value is generated by an extrapolation of the fourth compensation coefficient and the first compensation coefficient, and wherein a compensation coefficient for a grayscale range greater than the second grayscale value is generated by an extrapolation of the third compensation coefficient and the second compensation coefficient.

17. The display apparatus of claim 1, further comprising a memory which stores the first compensation coefficient, the second compensation coefficient and the sensing data, wherein the first compensator compensates the image data using the first compensation coefficient and the second compensation coefficient which are determined in a manufacturing operation of the display apparatus and stored in the memory, and wherein the second compensator compensates the image data using the sensing data sensed in real time in at least one of a power-off period and a power-on period.

18. A method of compensating an image of a display panel including pixels, the method comprising:

generating a first compensation coefficient based on sensing data of a pixel of the pixels for a first grayscale value;

generating a second compensation coefficient based on camera imaging data for a second grayscale value greater than the first grayscale value;

compensating image data based on the first compensation coefficient and the second compensation coefficient; and compensating the image data by modeling sensing data of entire grayscale range based on sensing data of the pixel for a third grayscale value and a fourth grayscale value.

19. The method of claim 18, wherein at least one of the pixels of the display panel comprises:

a first switching element including a control electrode connected to a first node, an input electrode which receives a first power voltage and an output electrode connected to a second node;

a second switching element including a control electrode which receives a first switching signal, an input electrode which receives a data voltage and an output electrode connected to the first node;

a third switching element including a control electrode which receives a second switching signal, an input electrode connected to the second node and an output electrode connected to a sensing line; and a light emitting element including an anode electrode connected to the second node and a cathode electrode which receives a second power voltage, wherein a sensing circuit connected to the sensing line comprises:

an operator including a first input electrode which receives a sensing voltage, a second input electrode which receives a reference voltage and an output electrode connected to an analog digital converter; and a capacitor connected between the first input electrode of the operator and the output electrode of the operator.

20. The method of claim 18, wherein the compensating the image data based on the first compensation coefficient and the second compensation coefficient comprises compensating the image data using the first compensation coefficient and the second compensation coefficient which are determined in a manufacturing operation of the display apparatus and stored in a memory, and wherein the compensating the image data by modeling the sensing data of the entire grayscale range comprises compensating the image data using the sensing data sensed in real time in at least one of a power-off period and a power-on period.

* * * * *